US012068304B2

(12) United States Patent
Plößl (10) Patent No.: US 12,068,304 B2
(45) Date of Patent: Aug. 20, 2024

(54) METHOD FOR PRODUCING A COMPONENT, AND COMPONENT (71) Applicant: OSRAM Opto Semiconductors GmbH, Regensburg (DE)

(72) Inventor: Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 590 days.

(21) Appl. No.: 17/430,622

(22) PCT Filed: Jan. 10, 2020

(86) PCT No.: PCT/EP2020/050582
§ 371 (c)(1),
(2) Date: Aug. 12, 2021

(87) PCT Pub. No.: WO2020/164826
PCT Pub. Date: Aug. 20, 2020

(65) Prior Publication Data
US 2022/0077067 A1  Mar. 10, 2022

(30) Foreign Application Priority Data
Feb. 14, 2019  (DE) .......................... 102019103761.1

(51) Int. Cl.
*H01L 25/00*      (2006.01)
*H01L 23/538*     (2006.01)
(Continued)

(52) U.S. Cl.
CPC ............. *H01L 25/50* (2013.01); *H01L 25/18* (2013.01); *H01L 27/156* (2013.01);
(Continued)

(58) Field of Classification Search
None
See application file for complete search history.

(56) References Cited

U.S. PATENT DOCUMENTS 8,168,430 B2   5/2012   Ariga et al.
9,748,309 B2   8/2017   von Malm
(Continued)

FOREIGN PATENT DOCUMENTS

DE   102007010242 A1   10/2007
DE   102007025992 A1   12/2008
(Continued)

*Primary Examiner* — Robert G Bachner
*Assistant Examiner* — Molly K Reida
(74) *Attorney, Agent, or Firm* — Slater Matsil, LLP (57) ABSTRACT In an embodiment a component includes a semiconductor chip, a connection member and a carrier, wherein the semiconductor chip is mechanically and electrically connected to the carrier via the connection member, wherein the connection member includes a contiguous metallic connecting layer and a plurality of metallic through-vias extending vertically through the connecting layer and being laterally spaced from the connecting layer by insulating regions, wherein the insulating regions are filled with a gaseous medium and are hermetically sealed, and wherein the gaseous medium contains an insulating gas having a higher breakdown field strength compared to nitrogen, or wherein a gas pressure is less than 1 mbar in the hermetically sealed insulating regions.

19 Claims, 7 Drawing Sheets (51) Int. Cl.
  *H01L 25/18*  (2023.01)
  *H01L 27/15*  (2006.01)
  *H01L 25/16*  (2023.01)
  *H01L 33/62*  (2010.01)

(52) U.S. Cl.
  CPC ........ *H01L 23/5384* (2013.01); *H01L 25/167* (2013.01); *H01L 33/62* (2013.01)

(56) References Cited

U.S. PATENT DOCUMENTS

| | | | |
|---|---|---|---|
| 10,388,694 | B2 | 8/2019 | Pfeuffer |
| 10,461,120 | B2 | 10/2019 | von Malm |
| 10,475,778 | B2 | 11/2019 | Pfeuffer et al. |
| 2005/0121768 | A1* | 6/2005 | Edelstein ......... H01L 23/49827 257/E23.067 |
| 2007/0205253 | A1 | 9/2007 | Hubner |
| 2010/0127377 | A1 | 5/2010 | Bauer et al. |
| 2012/0013022 | A1* | 1/2012 | Sabuncuoglu Tezcan ................... H01L 23/481 257/774 |
| 2012/0292782 | A1* | 11/2012 | Lee ....................... H01L 23/481 257/774 |
| 2018/0012801 | A1 | 1/2018 | Huber et al. |
| 2018/0151548 | A1* | 5/2018 | Pfeuffer ................ H01L 27/156 |
| 2020/0273907 | A1 | 8/2020 | Brick et al. |

FOREIGN PATENT DOCUMENTS

| | | |
|---|---|---|
| DE | 102011056888 A1 | 6/2013 |
| DE | 102015100686 A1 | 7/2016 |
| DE | 102015108545 A1 | 12/2016 |
| DE | 102016100351 A1 | 7/2017 |
| DE | 102017117504 A1 | 2/2019 |
| DE | 102017117540 A1 | 2/2019 |
| JP | H0430544 A | 2/1992 |
| JP | H06112403 A | 4/1994 |
| JP | 2006116564 A | 5/2006 |
| JP | 5083832 B2 | 11/2012 |
| JP | 2015501085 A | 1/2015 |
| JP | 2015056380 A | 3/2015 |
| JP | 2018516460 A | 6/2018 |
| WO | 2016193071 A1 | 12/2016 |

* cited by examiner

METHOD FOR PRODUCING A COMPONENT, AND COMPONENT

This patent application is a national phase filing under section 371 of PCT/EP2020/050582, filed Jan. 10, 2020, which claims the priority of German patent application 102019103761.1, filed Feb. 14, 2019, each of which is incorporated herein by reference in its entirety.

TECHNICAL FIELD

A method for producing a component, in particular an optoelectronic component, is specified. Furthermore, a component, in particular an optoelectronic component, is specified.

BACKGROUND

For the production of a mechanical and electrical connection between for instance a pixelated semiconductor chip and a carrier, for example in the form of an active matrix element, which is set up for electrically contacting the semiconductor chip, a connection member having a plurality of through-vias can be used. The density of the through-vias usually depends on the pixel size as well as on the lateral distances between the adjacent pixels. In the case of a particularly high pixel density, the electrical insulation of the through-vias poses a particular technical challenge.

SUMMARY

Embodiments provide a particularly cost-effective and simplified method for producing a compact component. Further embodiments provide a compact component having particularly reliable electrical connections.

According to at least one embodiment of a method for producing a component, a semiconductor chip, a connection member and a carrier are provided. The carrier is in particular configured for electrically contacting the semiconductor chip. The connection member may be arranged between the semiconductor chip and the carrier, thereby providing a mechanical and electrical connection between the semiconductor chip and the carrier. In particular, the connection member is attached directly to the semiconductor chip and directly to the carrier so that the component is free of additional layers, in particular free of further adhesion layers, arranged in the vertical direction between the semiconductor chip and the carrier. For example, the connection member has adhesion promoter surfaces that are directly adjacent to the semiconductor chip and/or to the carrier after the connection member is attached to the semiconductor chip and/or to the carrier. In particular, the adhesion promoter surface of the connection member is formed by surface of an adhesion promoter layer made of an adhesion promoter material, for example, of a solder material.

A vertical direction is generally understood to mean a direction which is directed transversely, in particular perpendicularly, to a main extension surface of the connection member. In contrast, a lateral direction is understood to mean a direction that runs along, in particular parallel to the main extension surface of the connection member. The vertical direction and the lateral direction are perpendicular to each other.

According to at least one embodiment of the semiconductor chip, it has a plurality of active regions, in particular of individually activatable active regions. The active regions may be formed as pixels. For example, the semiconductor chip is subdivided into a plurality of individually and independently activatable pixels arranged side by side in the lateral direction. The semiconductor chip may be a pixelated and/or segmented semiconductor chip. Radiation generated by the semiconductor chip can be emitted from the semiconductor chip during operation via a radiation exit surface of the semiconductor chip, which forms, for example, a main side of the semiconductor chip extending parallel to the lateral direction, wherein each pixel can represent a sub-region of the radiation exit surface. For example, the radiation exit surface forms a display. Alternatively, it is possible that the active regions are configured to detect electromagnetic radiation.

The semiconductor chip may be a functional semiconductor wafer with an integrated contact structure of contacts and/or circuits. Preferably, a semiconductor chip is a single and separately manageable module that can be plugged or soldered or glued onto a carrier and is electrically contacted in this way.

According to at least one embodiment of the semiconductor chip, it comprises a first semiconductor layer of a first charge carrier type, a second semiconductor layer of a second charge carrier type different from the first charge carrier, and an intermediate active layer configured for generating radiation or for detecting radiation. The first semiconductor layer and the second semiconductor layer may be an n-type semiconductor layer and a p-type semiconductor layer, respectively, or vice versa. For example, the active layer forms a p-n-junction region. The semiconductor layer sequence is based, for example, on a III-V or II-VI compound semiconductor material. The active layer is configured, for example, to emit electromagnetic radiation in the UV range, in the visible spectral range, such as in the blue spectral range, and/or in the infrared range during operation of the semiconductor chip or the component, or to convert such radiation into electrical signals.

In particular, the semiconductor layer sequence as a whole is formed to be contiguous along the entire lateral extent of the semiconductor chip. It is possible that at least one layer from the group comprising the first semiconductor layer, the second semiconductor layer and the active layer, or all layers of this group is/are formed to be contiguous. The semiconductor layer sequence is also considered to be contiguous if at least one of the above-mentioned layers is contiguous, while the other layers of the above-mentioned group are divided into a plurality of laterally spaced sublayers, for example, by separation trenches.

For example, the separation trenches extend through the first or second semiconductor layer into the active layer. It is also possible for the separation trenches to extend through the active layer and separate the active layer into a plurality of laterally spaced active sublayers. By the separation trenches, the sublayers, in particular the active sublayers, can be electrically contacted and activated independently from each other. Even in the absence of the separation trenches, however, it is possible to selectively activate local regions of the active layer due to the relatively low electrical cross-conductivity of the semiconductor layers, in particular of the p-type semiconductor layer. This is achieved in particular by applying a structured contact layer having spatially spaced contact members, each of which is formed to make electrical contact with different sub-regions of a semiconductor layer or of the active layer.

According to at least one embodiment of the method, the connection member comprises a coherent metallic connecting layer which is completely pierced by a plurality of metallic through-vias which are arranged next to one another in the lateral direction. The through-vias may be in the form of metallic and electrically conductive pins extending in particular throughout the connecting layer. "Metallic" may mean here and in the following that the corresponding metallic element consists of at least 70% by mass, 90% by mass or 99% by mass of metal.

In particular, the connecting layer is formed contiguously but not simply contiguously and has hole-like apertures. In a plan view of a top side of the connecting layer, the through-vias are then laterally completely surrounded by the connecting layer. For example, only a single through-via is disposed in each aperture. However, it is possible that exactly two through-vias are arranged in each aperture, which are provided for electrical contacting of a common active region, in particular a common pixel. The two through-vias in the common aperture are in particular assigned to different electrical polarities.

According to at least one embodiment of the method, the through-vias are electrically insulated from the connecting layer and spaced apart by insulating regions. The insulating regions prevent direct mechanical and electrical contact between the connecting layer and the through-vias or between the through-vias in a common aperture. The insulating regions are formed in particular as cavities between the through-vias and the connecting layer.

According to at least one embodiment of the method, the carrier is an active matrix element. The active matrix element can be based on a semiconductor material, such as Si or Ge, or on a semiconductor composite material GaN or GaAs. Preferably, the carrier is self-supporting and forms the mechanically stabilizing element for the optoelectronic component, for example.

Furthermore, the active matrix element can have a plurality of switches. Each switch may be, for example, a transistor such as a thin-film transistor, in particular a field-effect transistor. For example, the active matrix element is a metal-oxide-semiconductor component known as a CMOS component.

Each switch can be uniquely or unambiguously associated with an active region, in particular with a pixel of the semiconductor chip, via one of the through-vias of the connection member and electrically conductively connected to this active region. Each through-via is electrically conductively connected in particular to an electrical contact member of the semiconductor chip, in particular of the associated active region, and/or to an electrical contact member of the carrier, in particular of the associated switch. Thus, the corresponding active region can be electrically connected via the associated through-via. During operation of the component, it is possible to supply the active regions for instance individually and independently of one another or in groups with electrical current via the switches and thus to activate them electrically.

In at least one embodiment of a method for producing a component, a semiconductor chip, a connection member and a carrier are provided. The connection member has a contiguous metallic connecting layer and a plurality of metallic through-vias, wherein the through-vias are laterally spaced from the connecting layer by insulating regions. To establish a mechanical and electrical connection between the semiconductor chip and the carrier, the connection member is re-melted, wherein the insulating regions are filled with a gaseous medium and hermetically sealed. The heating of the connection member is carried out in particular in a heating chamber at a first gas pressure. To achieve improved dielectric strength of the insulating regions, the gaseous medium may contain an insulating gas that has a higher breakdown field strength compared to nitrogen. Alternatively or in addition, the first gas pressure can be lowered prior to hermetically sealing the insulating regions so that a gas pressure lower than the first gas pressure prevails in the subsequent hermetically sealed insulating regions. In particular, the gas pressure in the sealed insulating regions is less than 1 mbar.

For example, the first gas pressure, which is required in particular for efficient thermal coupling, is reduced immediately before the hermetic sealing of the insulating regions, such as immediately after the material of the connecting layer and/or the through-vias have/has reached the melting temperature or the solidus temperature. When the insulating regions are hermetically sealed at a reduced gas pressure, the reduced gas pressure, which is less than the original first gas pressure, prevails in the subsequent hermetically sealed insulating regions.

It was found that the critical electric field strength for dielectric breakdown for a given geometry of the insulating regions depends essentially on the gas filling of the insulating regions and on the pressure prevailing therein. In very low pressure regions, the breakdown field strength of the gas filling increases with the reduction of the gas pressure. In addition, the breakdown field strength depends directly on the composition of the gas filling. In particular, the breakdown field strength of the gas charge is greatly increased if the gas charge is a gas mixture comprising an insulating gas such as $SF_6$ or $C_5F_{10}O$ or of another fluorinated gas or consisting essentially of such an insulating gas.

According to at least one embodiment of the method, the semiconductor chip comprises a plurality of active regions, for instance in the form of individually activatable pixels. The carrier preferably comprises a plurality of switches provided for activating the active regions. The active regions may be electrically conductively connected to the switches via the through-vias.

According to at least one embodiment of the method, the re-melting of the connection member is performed in a heating chamber, wherein the thermal coupling of a heating block of the heating chamber to the connection member takes place at the first gas pressure which is between 1 mbar and 2000 mbar inclusive, for example between 100 mbar and 2000 mbar inclusive, 150 mbar and 1500 mbar, 200 mbar and 1200 mbar or between 300 mbar and 1000 mbar inclusive.

For thermal coupling, a carrier gas such as $H_2$ or $N_2$ may be supplied to the heating chamber. It is possible that the insulating gas, for example a fluorinated gas such as $SF_6$ or $C_5F_{10}O$, is already fed into the heating chamber or into the insulating regions together with the carrier gas or only subsequently during the re-melting process, for example immediately before the hermetic sealing of the insulating regions. In particular after a cleaning process and for instance shortly before the melting temperature or the solidus temperature of the material of the connecting layer and/or the through-vias is reached, the heating chamber is flooded with the insulating gas, which has a higher breakdown field strength compared with ambient air or oxygen or nitrogen. In case of doubt, for comparison, the breakdown field strengths at normal condition or at the gas pressure actually prevailing in the insulating regions, for example at a temperature of 20° C., are determined.

According to at least one embodiment of the method, the gaseous medium, which preferably contains the insulating gas, is enclosed in the insulating regions so that the first gas pressure prevails in the hermetically sealed insulating regions. The first gas pressure is essentially the gas pressure that is set up for the thermal coupling of the heating block of the heating chamber to the connection member. In particular, the melting temperature or the solidus temperature of the connecting layer or the through-vias, respectively, is obtained at the first gas pressure.

According to at least one embodiment of the method, the first gas pressure is lowered, in particular to the gas pressure trapped in insulating regions. For example, the gas pressure in the insulating regions is between and 1 mbar and $10^{-7}$ mbar inclusive. In other words, the first gas pressure is reduced, particularly immediately prior to hermetic sealing, to the gas pressure subsequently trapped in the insulating regions. For example, the gas pressure in the insulating regions is between 1 mbar and $10^{-5}$ mbar inclusive, between 1 mbar and $10^{-3}$ mbar inclusive, or between 0.1 mbar and $10^{-5}$ mbar inclusive, for example between 0.01 mbar and $10^{-5}$ mbar inclusive.

According to at least one embodiment of the method, a carrier gas is used in the heating of the connection member, wherein the insulating gas, which is different from the carrier gas, is supplied to the insulating regions before the hermetic sealing of the insulating regions. The gaseous medium trapped in the insulating regions may be a gas mixture of the carrier gas and the insulating gas. In particular, the gas mixture may partly comprise ambient air.

According to at least one embodiment of the method, the semiconductor chip comprises a growth substrate that serves as a mechanically stabilizing substrate of the semiconductor chip prior to attaching the semiconductor chip to the connection member. After the semiconductor chip is attached to the connection member, the growth substrate is preferably thinned, patterned, or removed from the semiconductor chip. The processing of the growth substrate may be performed before or after the attachment of the connection member to the carrier. The connection member thus serves as a mechanically stabilizing intermediate carrier of the component. A further auxiliary carrier, which mechanically stabilizes the semiconductor layer sequence during the structuring or removal of the growth substrate, can be dispensed with.

The semiconductor layer sequence of the semiconductor chip may be deposited on the growth substrate by an epitaxial process. For example, the n-type semiconductor layer is disposed between the growth substrate and the active layer. If the growth substrate is thinned, patterned or detached from the semiconductor chip, particularly clear light-dark contrasts between adjacent pixels as well as high efficiency of the semiconductor chip can be achieved.

According to at least one embodiment of the method, the connection member is already attached to the semiconductor chip or to the carrier when it is provided. For example, the connection member was previously applied directly to the semiconductor chip or to the carrier in a patterned manner. It is also conceivable that the connection member is formed by applying a layer over a large area and by partially removing this layer. It is also conceivable that the connection member has been previously attached to the semiconductor chip or to the carrier. It is also conceivable that, when provided, the connection member has two separate sub-regions, one sub-region being attached to or formed directly on the semiconductor chip, and the other sub-region being attached to the carrier or formed directly on the carrier. Each of the sub-regions may include a partial connecting layer and a plurality of partial through-vias. In particular, the re-melting of the connection member causes the separate sub-regions to be brought together, thereby forming a mechanical and electrical interconnection between the semiconductor chip and the carrier.

A component comprising a semiconductor chip, a connection member and a carrier is specified. The methods described above are particularly suitable for producing a component described herein. Therefore, the features described in connection with the component can be used for the methods, and vice versa.

In at least one embodiment of a component, it comprises a semiconductor chip, a connection member and a carrier, wherein the semiconductor chip is mechanically and electrically connected to the carrier via the connection member, in particular directly via the connection member. The connection member has a contiguous metallic connecting layer and a plurality of metallic through-vias which extend vertically throughout the connecting layer and are laterally spaced from the connecting layer by insulating regions. The insulating regions are filled with a gaseous medium and are hermetically sealed, wherein the gaseous medium includes an insulating gas that has a higher breakdown field strength compared to nitrogen. Alternatively or additionally, the component can be formed in such a way that a gas pressure less than 1 mbar prevails in the hermetically sealed insulating regions. The semiconductor chip has, for example, a plurality of individually activatable active regions in the form of pixels. The carrier contains a plurality of switches which are set up for activating the active regions, wherein the active regions are electrically conductively connected to the switches via the through-vias.

If the insulating regions are filled with such an insulating gas and/or only such a low gas pressure prevails in the hermetically sealed insulating regions, the insulating regions have sufficiently large breakdown field strength so that a minimum lateral distance between the through-vias or between the connecting layer and the through-vias can be selected to be particularly small. Except for producing tolerances, the smallest permissible insulation distance is significantly reduced by filling with the insulating gas and/or by the low gas pressure, so that a higher density of through-vias can be achieved without increased risk with regard to a possible electrical short circuit. In other words, for example, in a 3D integration of a semiconductor chip with an active matrix element, a separately fabricated connection member can be used, wherein an isolation distance between a not simply contiguous connecting layer of the connection member and a plurality of through-vias of the connection member can be significantly reduced.

According to at least one embodiment of the component, each of the through-vias is completely surrounded by the gaseous medium in lateral directions. The gaseous medium provides electrical isolation between the through-vias and between the connecting layer and the through-vias. Between the through-vias and/or between the connecting layer and the through-vias, the component is in particular free of a material in solid or liquid aggregate state, for example free of a plastic, a polymer or free of a silicon oxide such as SiO2 or of a silicon nitride such as SiN. In particular, at least 50 vol-%, 60 vol-% or 75 vol-% or 85 vol-% of the connection member may be a metal. The remaining portion of the connection member may be at least 15 vol-%, 25 vol-%, 30 vol-%, or at least 40 vol-% and formed, for example, by the insulating regions. It is possible that the connection member consists exclusively of metallic materials and of the insulating regions filled with the gaseous medium.

According to at least one embodiment of the component or method, the insulating gas is a fluorinated gas, for example sulfur hexafluoride $SF_6$ and/or perfluorovaleryl fluoride $C_5F_{10}O$ or another insulating gas at least equivalent in terms of breakdown field strength. From an environmental point of view, $C_5F_{10}O$ is preferred over SF6. Other fluorinated gases include CF3I or c-C4F8, perfluoroketones (PFK), e.g., $C_5$-PFK or $CF_3COCF(CF_3)_2$, and perfluoronitriles (PFN), e.g. C4-PFN or $(CF_3)_2CFCN$, chlorotrifluoroethane $(CF_3CHCl_2)$, 1,1,1,3,4,4,4-heptafluoro-3-trifluoromethyl-2-butanone $((CF_3)_2CFC(O)CF_3)$, or 2,3,3 tetrafluoro-2-trifluoromethyl propanenitrile $((CF_3)_2CFCN)$.

According to at least one embodiment of the component, the gaseous medium is a gas mixture, wherein the insulating gas has a molar fraction in particular between 30 mol % and 99 mol % inclusive, 50 mol % and 99 mol %, 70 mol % and 99 mol %, or between 90 mol % and 99 mol % inclusive. The admixture of less effective insulating gases is preferably less than 1 mol %, less than 10 mol %, or less than 50 mol %.

For example, in addition to a fluorinated gas such as $C_5F_{10}O$ and/or $SF_6$, the gas mixture may include other gases such as $N_2$, $CO_2$, $CF_4$, $O_2$ and/or $H_2$.

According to at least one embodiment of the component, the gaseous medium comprises the insulating gas, which has a higher breakdown field strength compared to nitrogen, wherein the gas pressure in the insulating regions is between 1 mbar and 2000 mbar, inclusive.

According to at least one embodiment of the component, the gaseous medium is free of an insulating gas having a higher breakdown field strength compared to nitrogen, wherein the gas pressure in the insulating regions is between 1 mbar and $10^{-7}$ mbar, inclusive.

According to at least one embodiment of the component, the gaseous medium contains nitrogen, wherein the molar fraction of which in the insulating regions is at least 60 mol %, 70 mol %, 80 mol %, 90 mol % or at least 95 mol %, wherein the gas pressure in the insulating regions is between 1 mbar and $10^{-7}$ mbar, inclusive. At such a low gas pressure, the gaseous medium, which in particular consists predominantly or exclusively of nitrogen, can have a sufficient breakdown field strength, so that a minimum lateral distance between the through-vias or between the through-vias and the connecting layer can be selected to be particularly small.

According to at least one embodiment of the component or method, the gaseous medium trapped in the insulating regions has an average breakdown field strength $E_m$. The connection member has a minimum lateral distance $D_{min}$ and a mean lateral distance $D_m$ between the connecting layer and the respective through-vias. In particular, the product $D_{min}*E_m$ is between 0.5 V and 10 V inclusive, for example between 2 V and 10 V inclusive, 3 V and 10 V, 4 V and 10 V, or between 6 V and 10 V inclusive. Preferably, the ratio $D_m/D_{min}$ is between 1 and 4 inclusive, for example between 1.5 and 4 inclusive for instance between 2 and 4 inclusive.

For example, if the connection member has exactly two or more through-vias in a common aperture, the product $D_{min}*E_m$ may also be between 0.5 V and 10 V, inclusive, and the ratio $D_m/D_{min}$ may be between 1 and 4, inclusive, where $D_{min}$ and $D_m$ are a minimum lateral distance and an average lateral distance, respectively, between adjacent through-vias in the respective common apertures.

According to at least one embodiment of the component or method, the connecting layer and the through-vias are formed from a solder material or from solder materials. The connecting layer and the through-vias may have the same material composition. In particular, they are formed from the same material or materials.

If the connecting layer and the through-vias are at least partially formed of a bonding agent material, such as a solder material, the semiconductor chip can be mechanically and electrically connected to the carrier directly via the connection member. The connection member may be directly adjacent to the semiconductor chip and/or to the carrier. In particular, the component is free of further layers, such as free of further adhesion promoter layers, which are not implemented as components of the semiconductor chip, the connection member and/or the carrier and are arranged between the connection member and the semiconductor chip and/or between the connection member and the carrier. In other words, the connection member may be implemented as a single layer or as a single stack of layers between the semiconductor chip and the carrier. In particular, the semiconductor chip is permanently fixed to the carrier exclusively by forming a metallic connection, such as a solder connection, in particular of purely eutectic solder systems, or a purely intermetallic connection.

According to at least one embodiment of the component or of the method, each active region is uniquely assigned to exactly one of the through-vias or to exactly one pair of two adjacent through-vias. In particular, the active regions are electrically conductively connected to the switches via the through-vias and can be formed to be activatable individually or in groups via the switches during operation of the semiconductor chip.

According to at least one embodiment of the component or of the method, the semiconductor chip has a semiconductor layer sequence having an active layer configured for generating or detecting radiation, wherein the active layer is configured to be contiguous along the entire lateral extent of the semiconductor chip. Alternatively or additionally, it is possible that the semiconductor layer sequence comprises a first semiconductor layer, a second semiconductor layer and an active layer which is located therebetween and configured for radiation generation or for radiation detection, wherein at least one of these layers is divided into a plurality of mutually laterally spaced sub-layers, for example by separation trenches. It is possible that only the first semiconductor layer or only the second semiconductor layer is divided into a plurality of laterally spaced sublayers. Additionally, it is conceivable that the active layer together with the first or second semiconductor layer is subdivided into a plurality of laterally spaced active sublayers.

According to at least one embodiment of the component or the method, the component is implemented as an optoelectronic component. The component may have a single semiconductor chip or a plurality of semiconductor chips, which are arranged in particular on a common carrier. A common connection member or a plurality of such connection members arranged next to each other may be used to attach the semiconductor chips to the carrier.

According to at least one embodiment of the component, the connection member comprises a top side and a bottom side. In particular, the top side and the bottom side are formed by surfaces of the connecting layer and/or of the through-vias. The connecting layer may be flush with the top side and/or with the bottom side in the vertical direction. The semiconductor chip may be in direct contact with the top side of the connection member in a support region and mechanically stably connected thereto. The through-vias are electrically isolated from the connecting layer and/or from each other by insulating regions. The semiconductor chip may be mechanically stably and electrically conductively connected by the connection member to the carrier located directly on the bottom side of the connection member. The connecting layer may be assigned to one of the electrical polarities of the component. Alternatively, it is possible that the connecting layer is electrically isolated from the semiconductor chip and serves only as a stabilizing layer for the semiconductor chip and as an electrical shield for the internal through-vias. Preferably, the connection member lies on the semiconductor chip over a large area. In this way, the connection member can simultaneously serve as a cooling element to effectively dissipate the heat generated by the semiconductor chip during operation, for example via the carrier.

According to at least one embodiment of the component or method, in a plan view of the semiconductor chip, the area of the support region is at least 7/12 or 3/4 or 5/6 of the area of a mounting side of the semiconductor chip facing the top side. The mounting side extends, for example, over the entire lateral extent of the semiconductor chip. The semiconductor chip is then mechanically carried or supported by the connection member over such an area portion. Such a large-area support region, wherein solid material of the semiconductor chip is in direct contact with solid material of the connection member, ensures in particular effective heat dissipation of the heat generated in the semiconductor chip.

In particular, prior to being mounted on the connection member, the semiconductor chip has exposed contact members on the mounting side, and the contact members can be directly adjacent to the through-vias or to the connecting layer after mounting of the semiconductor chip on the connection member. In particular, the contact members are formed as freely accessible components or freely accessible layers of a contact structure of the semiconductor chip. The contact structure can be directly adjacent to the semiconductor layer sequence, so that the semiconductor chip is in particular free of further mechanically self-supporting layers arranged in the vertical direction for instance between the semiconductor layer sequence and the contact structure or between the semiconductor layer sequence and the mounting side.

According to at least one embodiment of the component or method, the through-vias are in direct electrical and mechanical contact with first contact members of the carrier. In particular, the contact members of the semiconductor chip or of the carrier differ from the through-vias of the connection member, for example with respect to the material composition. Furthermore, the through-vias along the vertical direction are in particular not formed in one piece with the contact members of the semiconductor chip and/or of the carrier, but merely adjoin them. Microscopically, for example, interfaces between the through-vias and the associated contact members are visible.

Along the vertical direction, the connecting layer and/or the through-vias may each have a multilayer structure comprising a plurality of superimposed and different individual metallic layers. For example, the multilayer structure comprises an Au/AuSn, Cr/Ni/Sn/Ti/Au, Ti/Pt/Sn/In or Ti/Pt/Sn/Ti/Au layer sequence. In particular, the Ti layer is set up as a temporary barrier. The outer layers of the connecting layer and/or of the through-vias are preferably formed from a solder material. Particularly preferably, the connecting layer and/or the through-vias are solder elements having regions that are melted and subsequently cured in a soldering process. For example, the melting point of the connecting layer and/or of the through-vias is at least 180° C., 250° C., 280° C. or 350° C. to 450° C. (soft solder) or at least 450° C. (hard solder).

According to at least one embodiment, the connecting layer is electrically conductively connected to the semiconductor chip or to each active region. The connecting layer can, for example, form a common mating contact to the through-vias for all active regions. In operation, electrical charge carriers can be injected into the semiconductor chip via the through-vias and via the mating contact. Via the through-vias, the active regions can be activated individually and independently of each other.

According to at least one embodiment, the connecting layer is electrically isolated from the semiconductor chip and does not form an electrical contact to the semiconductor chip. On the mounting side in the region of the connecting layer, the semiconductor chip may then have, for example, an insulating layer that electrically insulates the connecting layer from the semiconductor chip. The insulating layer then covers the connecting layer in a plan view. In regions of the through-vias, the semiconductor chip is in particular free of the insulating layer. Each active region can be electrically connected via two through-vias. The two through-vias may be arranged in the same aperture or in two different apertures of the connecting layer. It is also possible that some through-vias are located at the edge of the component and are not completely surrounded laterally by the connecting layer. In this case, a different medium, such as a solid insulating medium, can be used to insulate the edge-side through-vias. Alternatively or additionally, it is possible that the lateral distance from the edge-side through-vias to the connecting layer is increased. If two through-vias are arranged in the same aperture, they are electrically insulated from each other, in particular by the gaseous medium.

According to at least one embodiment of the component or method, the connection member has a vertical layer thickness of at least 0.5 µm, 3 µm, 5 µm or 10 µm. Alternatively or additionally, the layer thickness of the connection member may be at most 100 µm, 50 µm, 40 µm or 30 µm. The layer thickness is measured between the top side and the bottom side. The through-vias may each have a lateral extent of at least 1 µm or 5 µm or 10 µm or 20 µm. Alternatively or additionally, the lateral extent of the through-vias is in each case at most 80 µm, 70 µm, 60 µm, 30 µm, 10 µm or 5 µm. The lateral distance between the adjacent through-vias in a common aperture and/or between the connecting layer and the through-vias may be at least 0.5 µm or 2 µm or 5 µm or 10 µm. Alternatively or additionally, the distance is at most 50 µm, 40 µm, 30 µm, 20 µm, 10 µm, 5 µm or 3 µm. This distance corresponds to the thickness of the insulating regions.

According to at least one embodiment of the component, the semiconductor chip is free of a growth substrate. Free of a growth substrate means here in particular that the growth substrate is completely removed or that residues of a growth substrate may still be arranged on the semiconductor layer sequence, but these alone are not sufficient to stabilize the semiconductor chip. In particular, the residues of the growth substrate may form a decoupling structure on the radiation exit surface or radiation entrance surface of the semiconductor chip.

According to at least one embodiment of the component, the semiconductor chip is mechanically non-self-supporting. That is, without additional carrier elements such as the connection member and/or the carrier of the component, the semiconductor chip would break or deform to the point of being unusable. In the present case, the semiconductor chip is stabilized and mechanically supported, for example, by the carrier and/or the connection member. In particular, the component is free of further carrier elements. In particular, the semiconductor chip itself is free of a stabilizing substrate.

BRIEF DESCRIPTION OF THE DRAWINGS

Further advantages, preferred embodiments and further embodiments of the component element or the method are apparent from the embodiments explained below.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

Figure 1A:
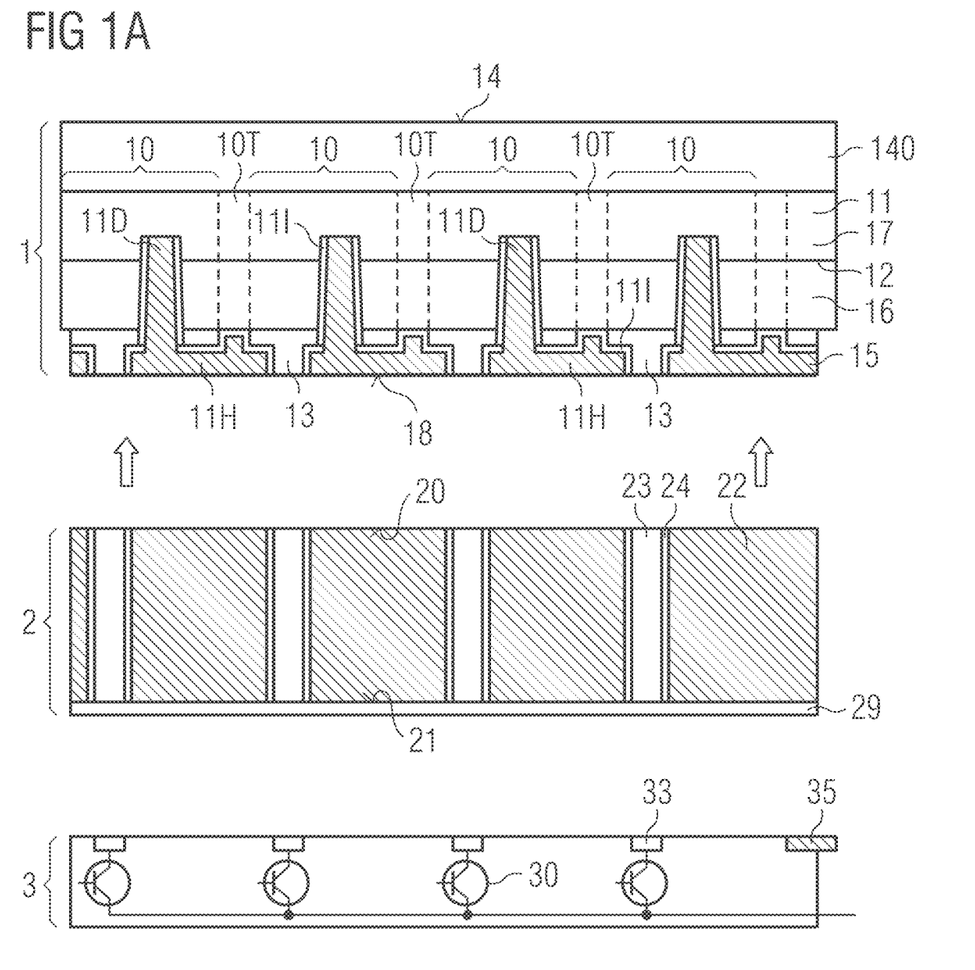
FIG. 1A shows an embodiment of a method for producing a component in schematic sectional view.

Referring to FIG. 1A, in a method for producing an optoelectronic component 100, a carrier 3, a connection member 2 and a semiconductor chip 1 are provided.

The semiconductor chip 1 has a semiconductor layer sequence 11 which, in particular, is epitaxially grown on a growth substrate 140. For example, the semiconductor chip 1 is a pixelated semiconductor chip 1 having an AlGaInN-based semiconductor layer sequence 11 and a growth substrate 140 particularly made of sapphire.

The semiconductor chip 1 has a semiconductor layer sequence 11 between a mounting side 18 and a radiation exit surface 14 or radiation entrance surface 14 opposite to the mounting side 18. The semiconductor layer sequence 11 includes a first semiconductor layer 16 and a second semiconductor layer 17, wherein the first semiconductor layer 16 is, for example, a p-type layer, and the second semiconductor layer 17 is, for example, an n-type layer, or vice versa. An active layer 12, for example in the form of a p-n-junction, is disposed between the first semiconductor layer 16 and the second semiconductor layer 17.

In particular, the semiconductor chip 1 or the semiconductor layer sequence 11 has a plurality of active regions 10, in particular in the form of pixels 10. The semiconductor chip 1 may comprise at least 10, 50, 100, 200 or 1000 such pixels. The lateral dimensions of a pixel 10 are, for example, between 3 μm and 300 μm inclusive, for example between 30 μm and 300 μm inclusive. For example, the radiation exit surface 14 of the semiconductor chip 1 has an area between 1 $mm^2$ and 50 $mm^2$, inclusive. It is possible for the semiconductor chip 1 to form a high-resolution display, for example in full HD applications. In this case, the pixels 10 may also have lateral dimensions between 1 μm and 10 μm inclusive, for instance between including 1 μm and 5 μm. It is also possible that the semiconductor chip 1 is formed as a pixelated light source in headlight components, in particular for vehicles. Applications of the semiconductor chip 1 in exterior or interior lighting components are also conceivable.

Each of the active regions 10 has sub-regions of the first semiconductor layer 17, the second semiconductor layer 16 and the active layer 12. In lateral directions, separation regions 10T are located between adjacent active regions 10. The separation regions 10T may be parts of the semiconductor layer sequence 11. Due to the low transverse conductivity of the semiconductor layers 16 and/or 17, the active regions 10 can be activated essentially independently from each other. Deviating from FIG. 1A, it is possible that the separation regions 10T are formed as separation trenches. The separation trenches may be in the form of openings in the semiconductor layer sequence 11. It is conceivable that the separation trenches are filled with an electrically insulating material.

A first contact member 13 and a second contact member 15 of the semiconductor chip 1 are associated with each active region 10. The contact members 13 and 15 are freely accessible, in particular on the mounting side 18, at least in places. The first contact member 13 is configured for electrically contacting the first semiconductor layer 16. The semiconductor chip 1 may have a plurality of such first contact members 13 which are spatially spaced apart from one another in the lateral direction. In particular, the first contact members 13 are spaced apart from each other by the separation regions 10T in top view. In particular, the lateral extents of the first contact members 13 determine the lateral dimensions of an active region 10. Each active region 10 may have a first contact member 13 uniquely associated therewith. That is, each active region 10 may have a first contact member 13 uniquely associated therewith, and vice versa.

The second contact member 15 is configured for electrically contacting the first semiconductor layer 16. The second contact member 15 can have a connection layer 11H, which is formed in particular to be radiation-reflective. The connection layer 11H can be completely or at least partially freely accessible on the mounting side 18. The second contact member 15 also has at least one through-contact 11D which is electrically conductively connected to the connection layer 11H. The through-contact 11D extends along the vertical direction in particular throughout the first contact member 13, the first semiconductor layer 16 and the active layer 12 into the second semiconductor layer 17.

According to FIG. 1A, the semiconductor chip 1 has a plurality of such through-contacts 11D, wherein each active region 10 may be assigned to one through-contact 11D or to a plurality of through-contacts 11D. It is possible that the connection layer 11H is formed to be contiguous and that all through-contacts 11D are electrically conductively connected to the connection layer 11H. It is also possible that the connection layer 11H has a plurality of laterally spaced sub-layers, each of which is electrically conductively connected to exactly one through-contact 11D or to a plurality of through-contacts 11D.

Figure 3A:
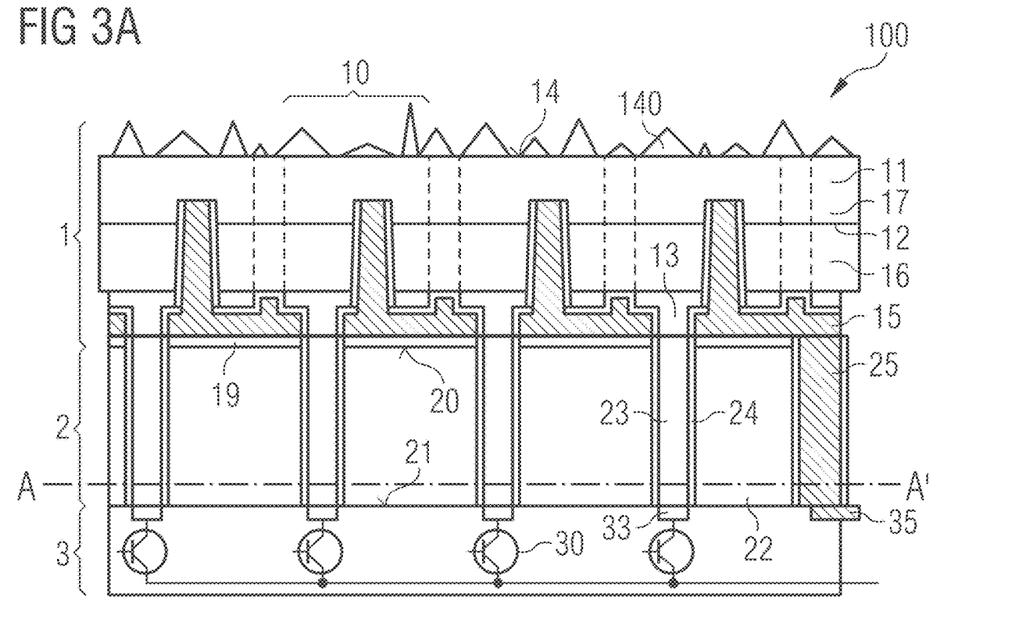

The semiconductor chip 1 has an insulating structure 11I. By means of the insulating structure 11I, the first contact member 13 is electrically insulated from the second contact member 15. Different first contact members 13 may be electrically isolated from each other by the insulating structure 11I. In lateral directions, the through-contacts 11D may be enclosed by the insulating structure 11I. Preferably, only the insulating structure 11I, the first contact members 13 and the second contact member 15 or several second contact members 15 are located in vertical direction between the mounting side 18 and the semiconductor layer sequence 11. Deviating from FIG. 1A, it is possible that the insulating structure 11I comprises an insulating layer 19 which at least partially covers the second contact member 15 on the mounting side 18 (FIG. 3A).

FIG. 1A shows how the connection member 2 can be applied to the mounting side 18 of the semiconductor chip 1, in particular in the form of a structured metal layer. The connection member 2 is formed by a connecting layer 22, through-vias 23 and insulating regions 24. The connection member 2 has a top side 20 and a bottom side 21 opposite to the top side 20, wherein the top side 20 and the bottom side 21 are formed by surfaces of the connecting layer 22 and the through-vias 23. The connecting layer 22 and the through-vias 23 may be formed at least partially or exclusively of a solder material. The insulating regions 24 are in particular empty spaces.

The connection member 2 may have an auxiliary carrier 29 on which the through-vias 23 and the connecting layer 22 are arranged. The auxiliary carrier 29 may have an adhesion-promoting surface, such as an adhesive surface. After the semiconductor chip 1 is mounted on the connection member 2, the auxiliary carrier 29 may be subsequently removed, exposing the bottom side 21. It is conceivable that the connection member 2 may also have such an auxiliary carrier on the top side 20, which is removed for instance before the semiconductor chip 1 is mounted on the connection member 2.

Alternatively, it is conceivable that the connection member 2 is formed directly on the semiconductor chip 1 or on the carrier 3, for example by using a patterned mask and/or an electroplating process. It is also conceivable that the connection member 2 comprises two analogous separate sub-regions, wherein each sub-region can have the same structure of the connection member 2 shown in FIG. 1A and are attached to the semiconductor chip 1 or on the carrier 3. In such cases, the auxiliary carrier 29 may be dispensed with.

Figure 2A:
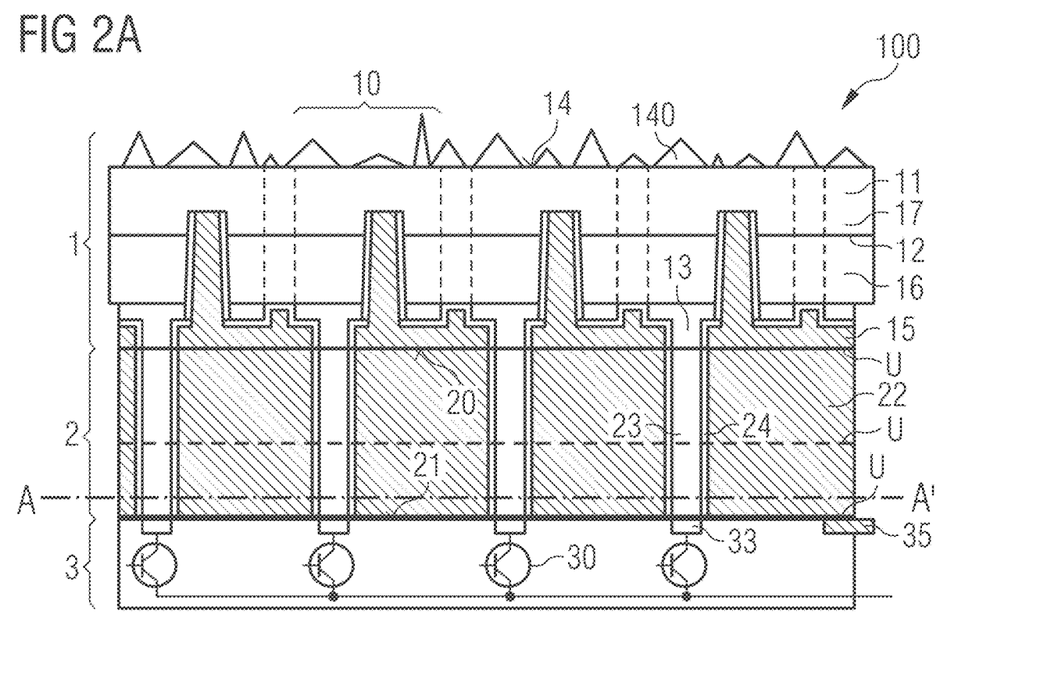
FIGS. 2A, 2B, 3A, 3B, 3C, 3D, 4A and 4B show schematic representations of various embodiments of a component, in each case in sectional view or in top view.

Thus, the semiconductor chip 1, the connection member 2 and the carrier 3 are provided, wherein the connection member 2 is already attached to the semiconductor chip 1 and/or to the carrier 3 when it is provided. Thus, the semiconductor chip 1 and the carrier 3 are still separated from each other. Only after re-melting the connection member 2 or the sub-regions of the connection member 2, the mechanical and electrical connection between the semiconductor chip 1 and the carrier 3 is made. Depending on how the connection member 2 is provided, i.e. as part of the semiconductor chip 1, as part of the carrier 3, or both as part of the semiconductor chip 1 and as part of the carrier 3, in cross-sectional view, a re-melting line U or a re-melting plane U is located immediately at the top side 20 or immediately at the bottom side 21 or in the vertical direction between the top side 20 and the bottom side 21 of the connection member 2 (FIG. 2A).

In cross-sectional view, the re-melting line U and the re-melting plane U are the connecting line U and connecting plane U, respectively, which is/are during re-melting of the connection member 2. Microscopically, the connecting line U and the connecting plane U can possibly be recognized in the finished component 100 by the fact that the component 100 has inner rounded cracks or rounded steps or other traces typical of the method at these points, in particular due to manufacturing tolerances. The rounded cracks or the steps are in particular consequences of the soldering process, wherein the through-vias 23 and the connecting layer 22 are temporarily in the liquid state. In the insulating regions 24, the through-vias 23 and the connecting layer 22 can have side flanks which are formed in particular in a contiguous manner. In particular, the side flanks do not have horizontal contours. Rather, the side flanks may have concave and/or convex curvatures in places. For example, the position of the re-melting line U or of the re-melting plane U and of typical traces of the method can be determined with the aid of an ion fine-beam system, for example on the basis of a small offset in the insulating regions 24.

The carrier 3 may be formed as an active matrix element having a plurality of switches 30 and a plurality of contact members 33 and 35. The contact members 33 and 35 may be freely accessible on a surface of the carrier 3, at least in regions. For example, the carrier 3 is coated in places with a Ti/Pt/Au layer. Each switch 30 may be uniquely connected to one of the through-vias 23 and to an active region 10 via a first contact member 33 of the carrier 3. The switches 30 are, for example, transistors. Each of the active regions 10 can be individually and independently activated via the switches 30.

Figure 1B:
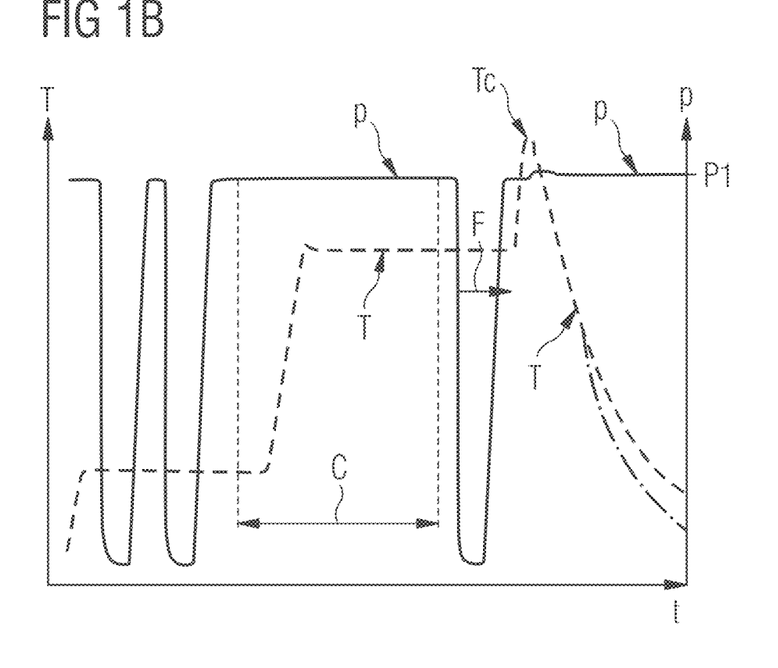
FIGS. 1B and 1C show different embodiments of a method for producing a component.
Figure 1C:
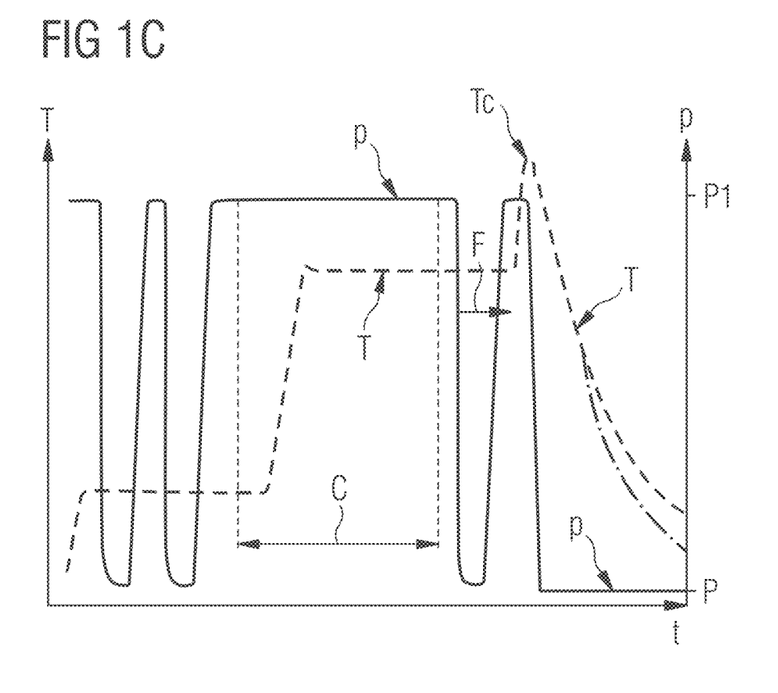

In FIGS. 1B and 1C, different diagrams are used to schematically illustrate different embodiments of a method for producing a component 100, wherein the connection member 2 is fixed between the semiconductor chip 1 and the carrier 3.

FIGS. 1B and 1C show diagrams for pressure p and temperature T as a function of time t. After an initial heating phase and a cleaning phase C, for example with formic acid, the filling phase F takes place. During these phases, the temperature in the heating chamber or the temperature of the connection member 2 increases essentially monotonically up to a critical temperature Tc, which is indicated in particular by the melting temperature or the solidus temperature of the material of the connection member 2. For an efficient thermal coupling of the heating chamber to the connection member 2, the heating phase, the cleaning phase and/or the filling phase are/is performed at a gas pressure P1. As shown in FIGS. 1B and 1C, the gas pressure can be briefly reduced, in particular between the phases, for example when gaseous medium is pumped out of the heating chamber or fed into the heating chamber.

The thermal coupling of the individual components, i.e. the semiconductor chip 1, the connection member 2 and the carrier 3, is ensured by the gas pressure prevailing in the heating chamber, in particular of a carrier gas. During re-melting, the heating chamber may be flooded with an insulating gas, for example $N_2$, $SF_6$, $C_5F_{10}O$ or with an equivalent alternative. Before or after re-melting, the gas in the heating chamber can be pumped out. If required, the gas can be recollected and reused for subsequent process steps.

It is conceivable that, prior to hermetically sealing the insulating regions 24, the connection member 2 is first temporarily connected to the carrier 3 and/or to the semiconductor chip 1. A friction welding process, in particular an ultrasonic friction welding process, can be applied for this purpose. After filling the insulating regions 24 with the gaseous medium, the insulating regions 24 can be hermetically sealed, for example by means of a soldering process.

The embodiments shown in FIGS. 1B and 1C differ mainly in the final heating phase, in particular in the presence of the gaseous medium that should be trapped in the insulating regions 24. The composition of the gaseous medium is determined in particular in the filling phase F. During the filling phase F, the heating chamber can be flooded with an insulating gas such as nitrogen, $SF_6$ and/or $C_5F_{10}O$. In the final heating phase, wherein the critical temperature Tc is reached, the gas pressure p preferably remains essentially constant at P1 just before reaching, upon reaching and shortly after reaching the critical temperature Tc. The first gas pressure P1 then prevails in the hermetically sealed insulating regions 24. In particular, the gaseous medium in this case contains the insulating gas, which has a higher breakdown field strength compared to nitrogen. The insulating gas is, for example, a fluorinated gas such as $SF_6$ or $C_5F_{10}O$.

In contrast to FIG. 1B, the gas pressure P1 according to FIG. 1C is reduced in the final heating phase, in particular just before the critical temperature Tc is reached, to the gas pressure P which should be trapped in the insulating regions 24. In this case, the gaseous medium trapped in the insulating regions 24 may mainly or exclusively comprise gases having a low breakdown field strength compared to a fluorinated gas such as $SF_6$ and/or $C_5F_{10}O$. For example, the gaseous medium is a nitrogen-filling. Alternatively, it is possible that the gaseous medium contains at least one insulating gas that has a higher breakdown field strength compared to nitrogen. Unlike vacuum insulation, there is no significant risk here of losing the insulation effect over time due to leakage, especially since large molecules show negligible permeation through the material of the connection member 2, in particular through the solder material.

Furthermore, for implementing the two embodiments shown in FIGS. 1B and 1C, similar proven mounting procedures can be substantially maintained, since, for example, no additional assembly equipment is required to mount the individual component.

Figure 1D:
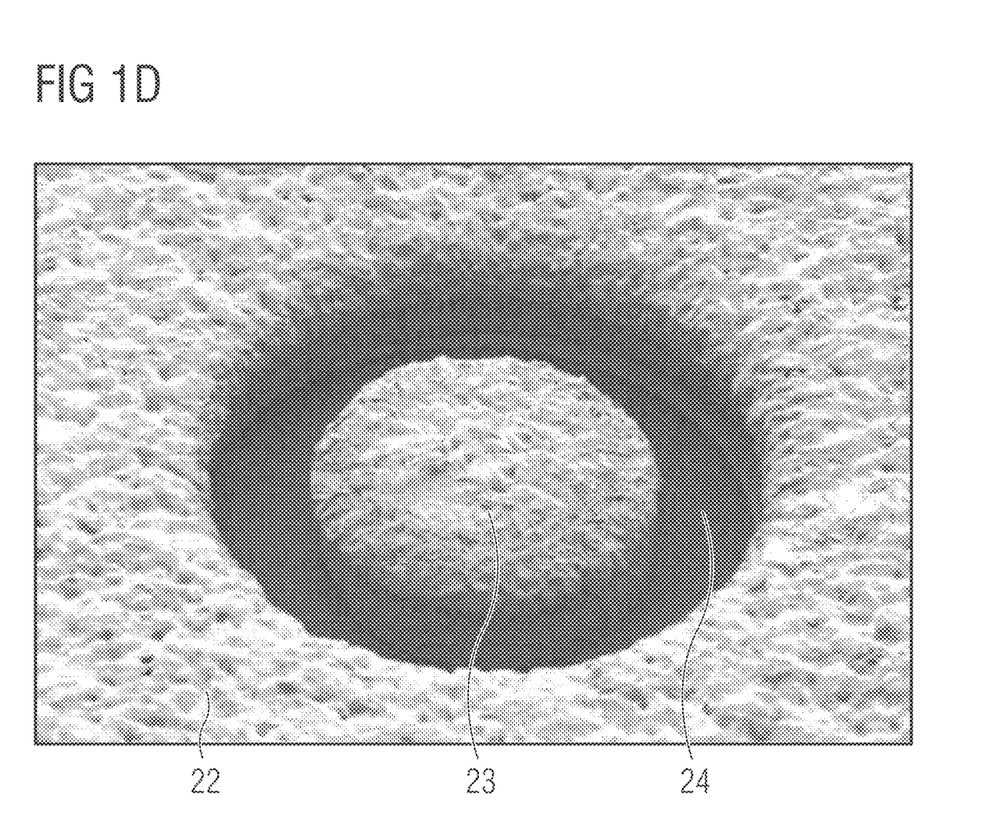
FIG. 1D shows a schematic representation of a sub-region of a connection member.

FIG. 1D shows a photo-like representation of a section of the connection member 2. The result of scanning electron-micrography shows the through-via 23 in the form of a solder island which is surrounded in lateral directions by the connecting layer 22 in the form of a solder lake. The through-via 23 is spatially spaced from the connecting layer 22 on all sides by the insulating region 24 in the form of a separation ring. The insulating region 24 is filled with a gaseous medium containing, for example, nitrogen and/or preferably a fluorinated gas such as $SF_6$ or $C_5F_{10}O$.

After the semiconductor chip 1 is permanently attached to the connection member 2, the growth substrate 140 can be detached from the semiconductor chip 1, for example, using a laser lift-off process. Also, the growth substrate 140 can be thinned or patterned to form out-coupling structures on the radiation entrance surface or radiation exit surface 14 of the semiconductor chip 1 (FIG. 2A). As an alternative to forming the in-coupling or out-coupling structures, the second semiconductor layer 17 may itself be patterned.

The method described here can take place in a wafer level. It is possible that a plurality of semiconductor chips 1 and/or a plurality of carriers 3 initially are parts of a wafer. After the connection member 2 has been applied, the wafer can be separated to form individual components 10 or individual semiconductor chips 1 comprising the separated connection member 2 and/or individual carriers 3 comprising the separated connection member 2. The bonding of the semiconductor chip 1 to the associated carrier 3 can be carried out as a so-called chip-to-wafer process or wafer-to-wafer process.

FIG. 2A shows an exemplary embodiment of a component 100 in sectional view. The component 100 can be produced by a method described here, in particular by the method shown in FIG. 1A. The features described in connection with the method shown in FIG. 1A can therefore also be used for the component 100 shown in FIG. 2A, and vice versa.

The component 100 comprises a semiconductor chip 1 which is attached to a carrier 3 via a connection member 2. In particular, the connection member 2 is in direct contact with both the semiconductor chip 1 and the carrier 3. The semiconductor chip 1 is divided in the lateral direction into a plurality of adjacent active regions 10. Each active region 10 can be activated individually and independently from each other, so that the radiation exit surface 14 of the semiconductor chip 1 forms, in particular, a pixelated display. Each active region in the form of a pixel 10 may form a pixel of the display. It is possible that the active regions 10 can be activated in groups.

In particular, the semiconductor chip 1 has a common electrode formed by the connection layer 15 or by the second contact members 15. The common electrode is electrically conductively connected to a contact member 35 of the carrier 3 via the connecting layer 22. The connecting layer 22 thus forms a common mating contact for all active regions 10 to the contacts formed by the through-vias 23. In addition, the semiconductor chip 1 includes a plurality of first individual contact members 13, each of which is configured to make electrical contact with an active region 10. The contact members 13 are each electrically conductively connected to one of the first contact members 33, and thus to one of the switches 30 of the carrier 3, via one of the through-vias 23. The through-vias 23 are arranged in the lateral direction such that they overlap with the first contact members 13 of the semiconductor chip 1 and are in direct electrical and mechanical contact with the first contact members 13.

According to FIG. 2A, the contacting of the second semiconductor layer 17 of the semiconductor layer sequence 1 is performed via the connecting layer 22, whereas the contacting of the first semiconductor layer 16 or the contacting of the sub-regions of the first semiconductor layer 16 is performed via the through-vias 23.

Figure 2B:
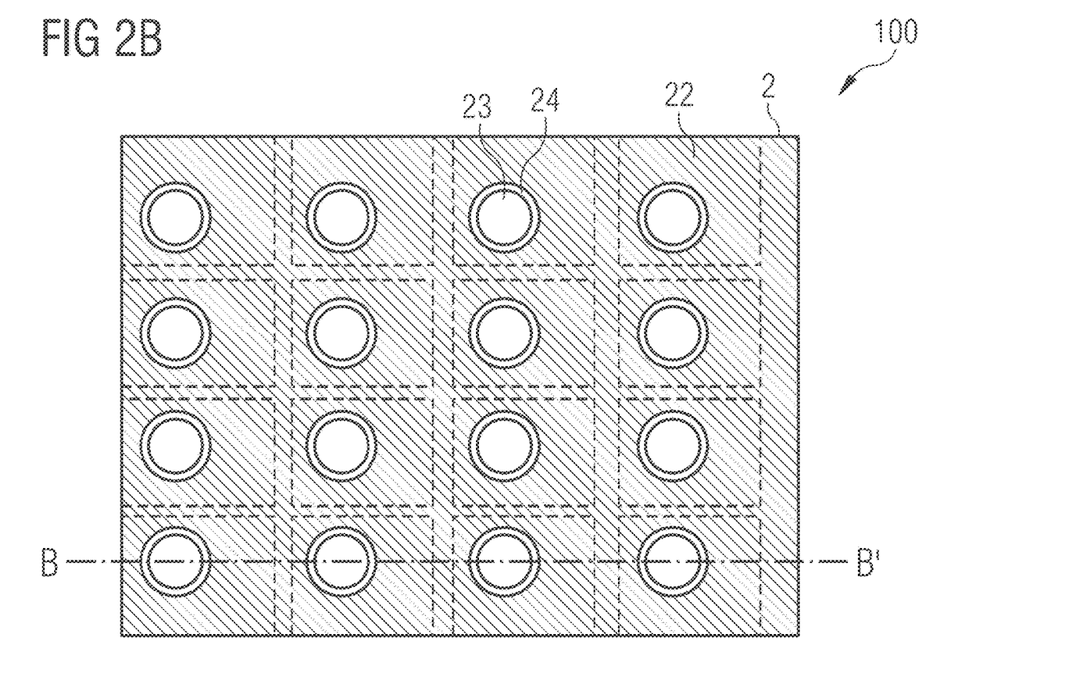

In FIG. 2B, a top view of the connection member 2 is shown along the sectional plane AA' of FIG. 2A, while FIG. 2A shows a sectional view through the component wo along the dashed plane BB' of FIG. 2B. It can be seen here that each of the active regions 10, indicated by the dashed rectangles, is associated with a through-via 23 which is completely surrounded by the insulating region 24 and the connecting layer 22.

The exemplary embodiment illustrated in FIG. 3A is substantially the same as the exemplary embodiment of a component wo illustrated in FIG. 2A. In contrast thereto, the component wo has an insulating layer 19 which electrically insulates the semiconductor chip 1 from the connecting layer 22. The insulating layer 19 may be contiguous. In particular, the insulating layer 19 has a plurality of openings through which the through-vias 23 extend. The insulating layer 19 can serve as a structured mask for applying the through-vias 23 onto the semiconductor chip 1, in particular onto the contact members 15 or onto the connection layer 15, wherein the mask remains on the semiconductor chip 1 after the through-vias 23 have been formed.

For electrical contacting of the contact member 15 or the connection layer 15, the connection member 2 has at least one further through-via 25 which electrically connects the contact member 15 to the carrier 3, in particular to a contact member 35 of the carrier 3. The further through-via 25 can also be completely surrounded in lateral directions by an insulating region 24 and/or by the connecting layer 22, wherein the further through-via 25 is laterally spaced from the connecting layer 22 and electrically insulated therefrom. The connecting layer 22 may thus be electrically isolated from the semiconductor chip 1 and/or from the carrier 3.

Figure 3B:
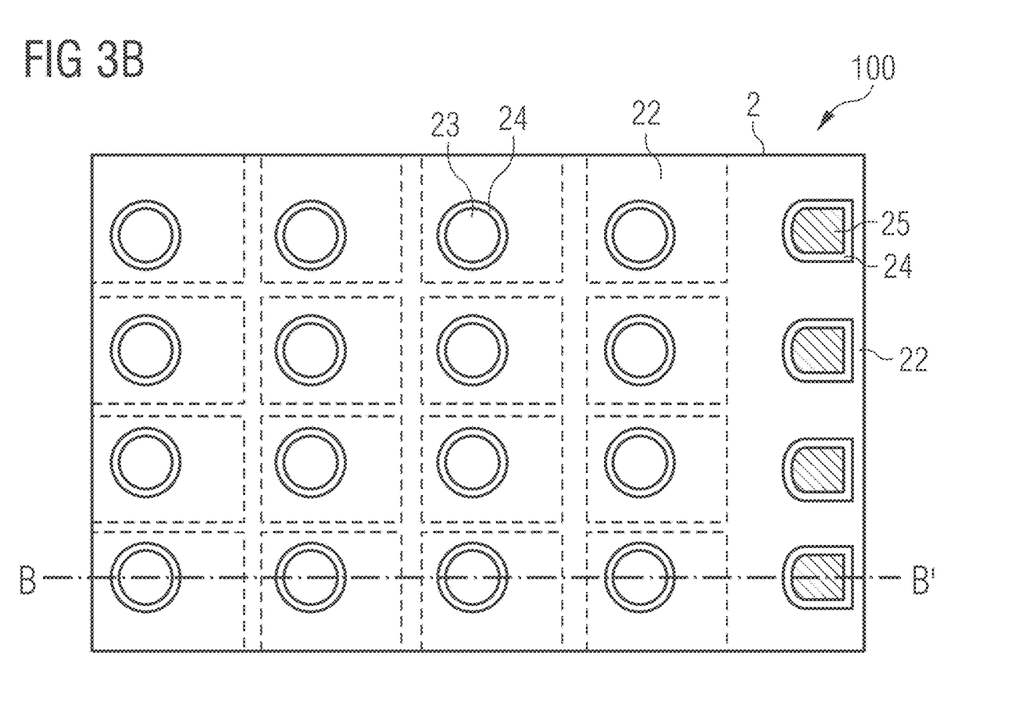

FIG. 3B shows a top view of the connection member 2 along the sectional plane AA' of FIG. 3A, while FIG. 3A shows a sectional view through the component wo along the dashed plane BB' of FIG. 3B. It can be seen here that the connection member 2 has a plurality of further through-vias

25. The further through-vias 25 are located in particular at an edge of the connection member 2, but may be completely surrounded by the connecting layer 22 in lateral directions.

Figure 3C:
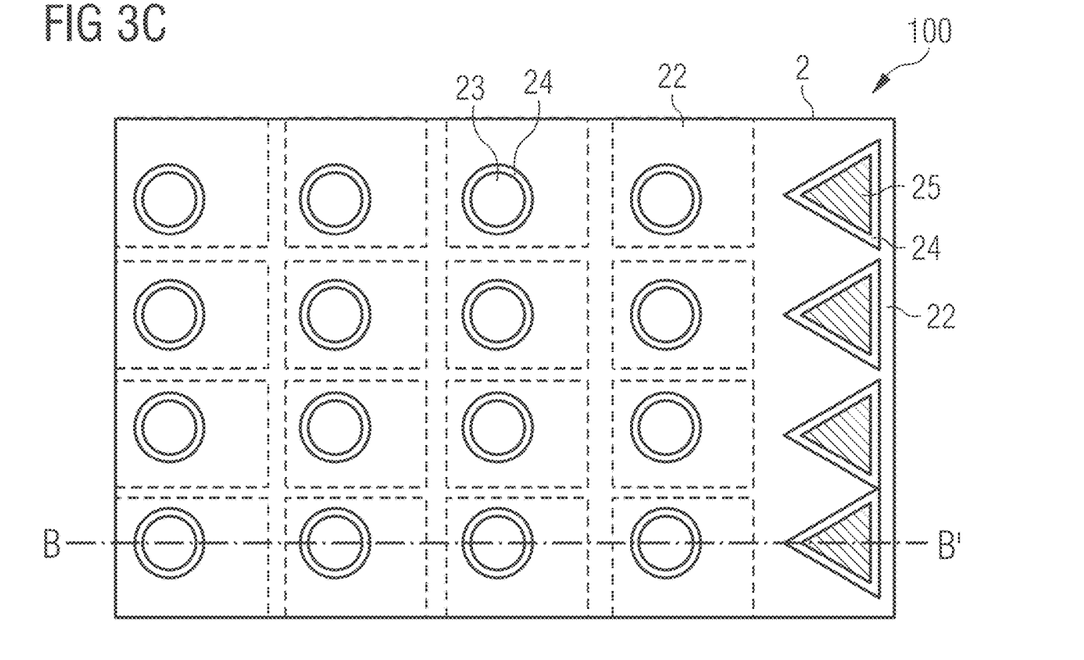

The exemplary embodiment shown in FIG. 3C essentially corresponds to the exemplary embodiment of a component wo shown in FIG. 3B. In FIG. 3B, the cross-sectional areas of the further through-vias 25 are composed of semicircles or circle segments and rectangles. In contrast, the further through-vias 25 shown in FIG. 3C each have a triangular cross-section. The through-via 23 and the other through-vias 25 can also have other cross-sectional areas, such as circular, square or elliptical cross-sectional areas.

Figure 3D:
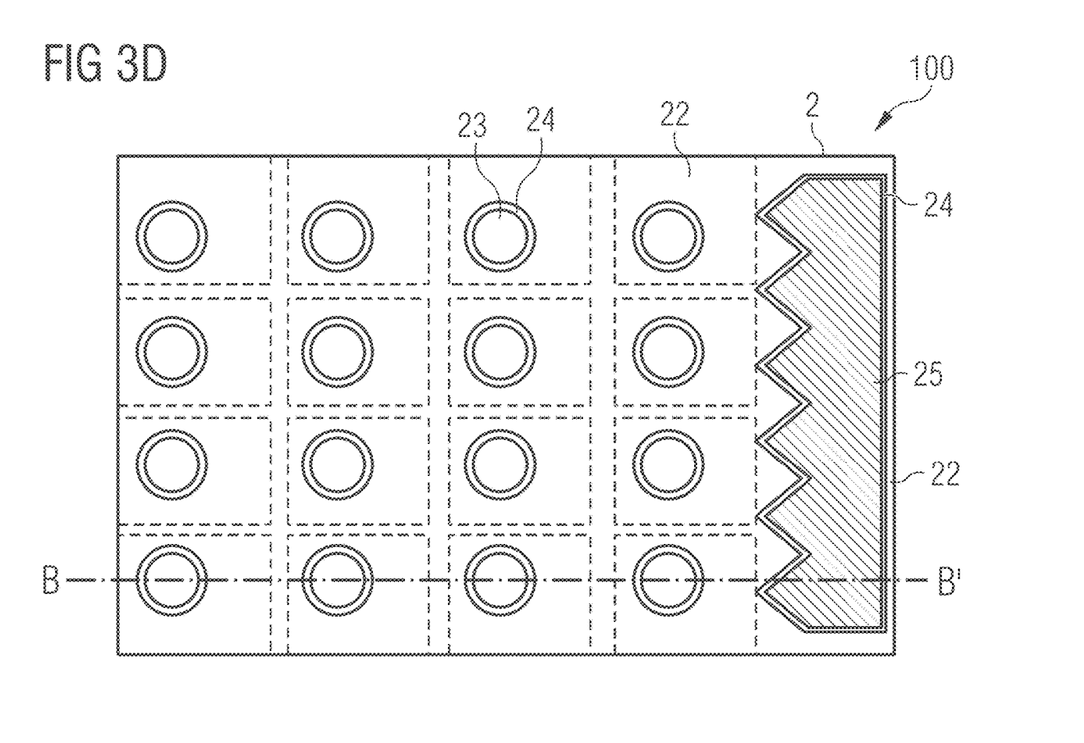

The exemplary embodiment shown in FIG. 3D is substantially the same as the exemplary embodiment of a component 100 shown in FIG. 3B or 3C, except that the connection member 2 has a single further through-via 25 extending along a lateral direction over a major portion of the extent of the connection member 2.

Figure 4A:
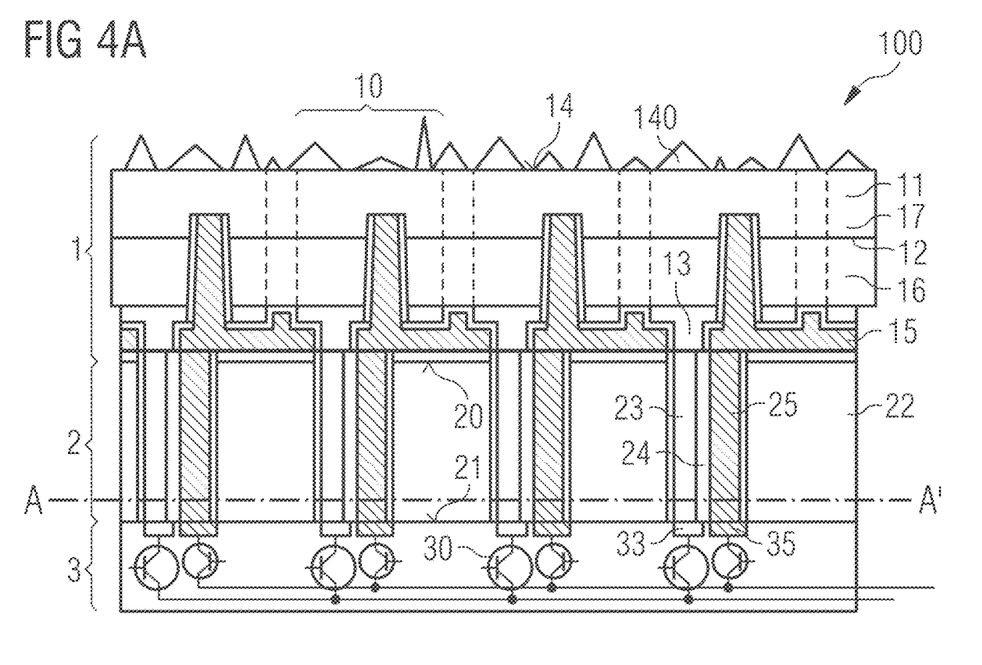

The exemplary embodiment illustrated in FIG. 4A is substantially the same as the exemplary embodiment of a component 100 illustrated in FIG. 3A. In contrast thereto, there is not only a single through-via 23 in an opening or aperture of the connecting layer 22. Rather, for each through-via 23 there exists a further through-via 25 arranged adjacent thereto.

The through-via 23 and the further through-via 25 form a pair of through-vias, in particular for electrically contacting an active region 10, and are arranged in a common opening of the connecting layer 22. The through-via 23 and the further through-via 25 are not separated from one another by the connecting layer 22 but only by the insulating region 24. On the carrier 3, each through-via 23 and each further through-via 25 is assigned to its own switch 30, so that the active regions 10 can be energized individually and independently of one another both via the through-vias 23 and the further through-vias 25. The further through-vias 25 are each electrically conductively connected to one of the second contact members 15 of the semiconductor chip, thus the second contact members 15 can be spatially separated from one another in lateral directions.

Figure 4B:
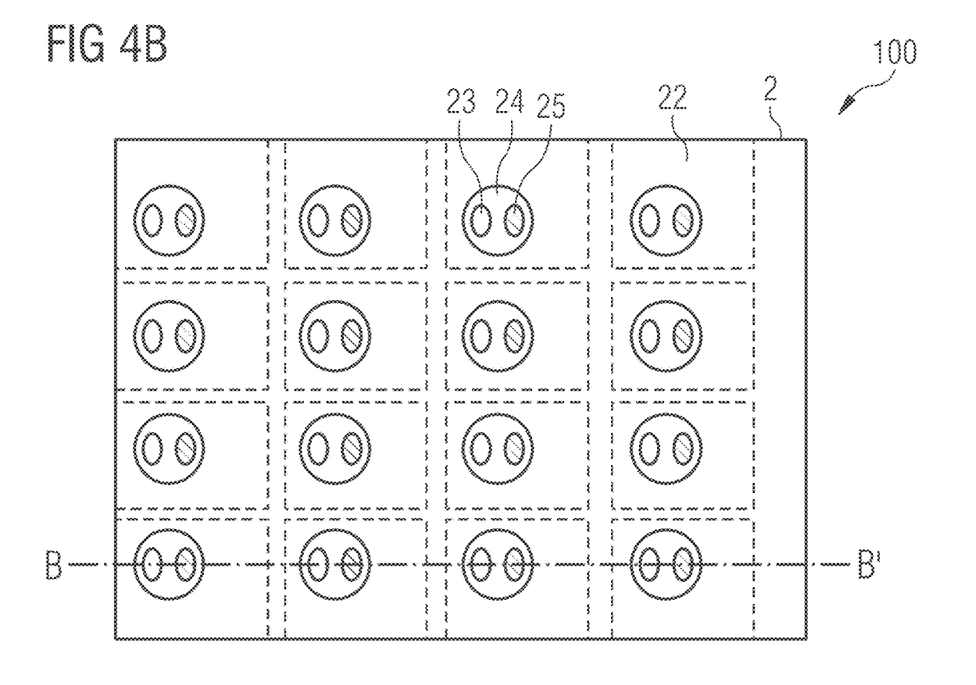

In FIG. 4B, a top view, the connection member 2 is shown along the sectional plane AA' of FIG. 4A, while FIG. 4A shows a sectional view through the component 100 along the dashed plane BB' of FIG. 4B. In top view, as shown in FIG. 4B, it can be seen that a through-via 23 and a through-via 25 are arranged in each opening of the connecting layer 22, which are separated from each other by the insulating region 24.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

The invention claimed is:

1. A method for producing a component, the method comprising:
    providing a semiconductor chip, a connection member, and a carrier, wherein the connection member comprises a contiguous metallic connecting layer and a plurality of metallic through-vias laterally spaced from the connecting layer by insulating regions; and
    re-melting the connection member to establish a mechanical and electrical connection between the semiconductor chip and the carrier,
    wherein re-melting the connection member is carried out at a first gas pressure and, for obtaining an improved dielectric strength of the insulating regions,
    wherein the insulating regions are filled with a gaseous medium and are hermetically sealed, and
    wherein the gaseous medium contains an insulating gas which has a higher breakdown field strength compared to nitrogen, or
    wherein the first gas pressure is lowered before hermetically sealing the insulating regions so that in the subsequent hermetically sealed insulating regions a gas pressure is lower than the first gas pressure and is less than 1 mbar.

2. The method according to claim 1, wherein the re-melting of the connection member is carried out in a heating chamber, wherein a thermal coupling of a heating block of the heating chamber and the connection member takes place at the first gas pressure, which is between 1 mbar and 2000 mbar, inclusive.

3. The method according to claim 1, wherein the gaseous medium is trapped together with the insulating gas in the insulating regions, and the first gas pressure prevails in the hermetically sealed insulating regions.

4. The method according to claim 1, wherein first gas pressure is lowered and the gas pressure in the insulating regions is between 1 mbar and 10-7 mbar inclusive.

5. The method according to claim 1, further comprising using a carrier gas while heating the connection member, wherein the insulating gas, which is different from the carrier gas, is supplied to the insulating regions before hermetic sealing of the insulating regions.

6. The method according to claim 1, wherein the semiconductor chip has a growth substrate which serves as a mechanically stabilizing substrate of the semiconductor chip before the semiconductor chip is bonded to the connection member, and wherein the growth substrate is thinned, patterned, or removed from the semiconductor chip after the semiconductor chip is attached to the connection member.

7. A component comprising:
    a semiconductor chip;
    a connection member; and
    a carrier,
    wherein the semiconductor chip is mechanically and electrically connected to the carrier via the connection member,
    wherein the connection member comprises a contiguous metallic connecting layer and a plurality of metallic through-vias extending vertically through the connecting layer and being laterally spaced from the connecting layer by insulating regions,
    wherein the insulating regions are filled with a gaseous medium and are hermetically sealed, and
    wherein the gaseous medium contains an insulating gas having a higher breakdown field strength compared to nitrogen, or
    wherein a gas pressure is less than 1 mbar in the hermetically sealed insulating regions.

8. The component according to claim 7,
    wherein the semiconductor chip comprises a plurality of active regions,
    wherein the carrier contains a plurality of switches configured to activate the active regions, and
    wherein the active regions are electrically conductively connected to the switches via the through-vias.

9. The component according to claim 7, wherein the insulating gas is a fluorinated gas.

10. The component according to claim 7, wherein the gaseous medium is a gas mixture, and wherein the insulating gas has a molar fraction between 30 mol % and 99 mol %, inclusive.

11. The component according to claim 7, wherein the gaseous medium comprises the insulating gas, and wherein the gas pressure in the insulating regions is between 1 mbar and 2000 mbar, inclusive.

12. The component according to claim 7, wherein the gaseous medium is free of the insulating gas, and wherein the gas pressure in the insulating regions is between 1 mbar and 10-7 mbar, inclusive.

13. The component according to claim 7, wherein the gaseous medium contains nitrogen, whose molar fraction in the insulating regions is at least 60 mol %, and wherein the gas pressure in the insulating regions is between 1 mbar and 10-7 mbar, inclusive.

14. The component according to claim 7,
wherein the gaseous medium trapped in the insulating regions has an average breakdown field strength Em,
wherein the connection member has a minimum lateral distance Dmin and a mean lateral distance Dm between the connecting layer and the respective through-vias,
wherein a product Dmin*Em is between 0.5 V and 10 V, inclusive, and
wherein a ratio Dm/Dmin is between 1 and 4, inclusive.

15. The component according to claim 7, wherein the connecting layer and the through-vias are formed from a solder material or from solder materials.

16. The component according to claim 7, wherein the connecting layer and the through-vias have the same material composition.

17. The component according to claim 7,
wherein the semiconductor chip comprises a plurality of individually activatable pixels,
wherein the carrier includes a plurality of switches configured to activate the pixels,
wherein each pixel is uniquely assigned to exactly one of the through-vias or to exactly to one pair of two adjacent through-vias, and
wherein the pixels are electrically conductively connected to the switches via the through-vias and are configured to be activatable individually or in groups via the switches.

18. The component according to claim 7, wherein the semiconductor chip has a semiconductor layer sequence comprising an active layer configured to generate or detect radiation, and wherein the active layer is contiguous along an entire lateral extent of the semiconductor chip.

19. The component according to claim 7, wherein the semiconductor chip comprises a semiconductor layer sequence having a first semiconductor layer of a first charge carrier type, a second semiconductor layer of a second charge carrier type, and an active layer located therebetween and configured to generate radiation or detect radiation, and wherein at least one of the layers is subdivided by separation trenches into a plurality of laterally spaced sublayers.

* * * * *